US007816188B2

(12) United States Patent
Vyvoda et al.

(10) Patent No.: US 7,816,188 B2
(45) Date of Patent: Oct. 19, 2010

(54) PROCESS FOR FABRICATING A DIELECTRIC FILM USING PLASMA OXIDATION

(75) Inventors: Michael A. Vyvoda, Fremont, CA (US); N. Johan Knall, Sunnyvale, CA (US); James M. Cleeves, Redwood City, CA (US)

(73) Assignee: SanDisk 3D LLC, Milpitas, CA (US)

( * ) Notice: Subject to any disclaimer, the term of this patent is extended or adjusted under 35 U.S.C. 154(b) by 1657 days.

(21) Appl. No.: 09/918,853

(22) Filed: Jul. 30, 2001

(65) Prior Publication Data

US 2003/0022526 A1 Jan. 30, 2003

(51) Int. Cl.
*H01L 21/00* (2006.01)
(52) U.S. Cl. .......................................... 438/131; 365/51
(58) Field of Classification Search ................. 438/131, 438/467, 600, 771, 474, 798, 778; 365/225.7, 365/51, 221.7
See application file for complete search history.

(56) References Cited

U.S. PATENT DOCUMENTS

| | | | | |
|---|---|---|---|---|
| 4,581,248 A | * | 4/1986 | Roche | 427/554 |
| 4,684,541 A | * | 8/1987 | Franciosi | 438/767 |
| 5,847,441 A | | 12/1998 | Cutter et al. | |
| 5,869,149 A | * | 2/1999 | Denison et al. | 427/579 |
| 5,913,138 A | | 6/1999 | Yamaoka et al. | |
| 5,930,650 A | * | 7/1999 | Chung et al. | 438/448 |
| 5,962,079 A | * | 10/1999 | Koberstein et al. | 427/508 |
| 6,170,428 B1 | * | 1/2001 | Redeker et al. | 118/723 I |
| 6,185,122 B1 | | 2/2001 | Johnson et al. | |
| 6,200,837 B1 | | 3/2001 | Ihn et al. | |
| 6,296,780 B1 | * | 10/2001 | Yan et al. | 216/67 |
| 6,335,288 B1 | * | 1/2002 | Kwan et al. | 438/694 |
| 6,399,520 B1 | * | 6/2002 | Kawakami et al. | 438/778 |
| 6,500,710 B2 | * | 12/2002 | Nakagawa | 438/257 |
| 6,509,283 B1 | * | 1/2003 | Thomas | 438/787 |
| 6,541,312 B2 | * | 4/2003 | Cleeves et al. | 438/131 |
| 2002/0137266 A1 | * | 9/2002 | Moon et al. | 438/166 |
| 2003/0211705 A1 | * | 11/2003 | Tong et al. | 438/455 |

OTHER PUBLICATIONS

Article, "Plasma-Assisted Oxidation, Anodization, And Nitridation of Silicon," D.W. Hess, *IBM® Journal of Research & Development*, vol. 43, No. 1/2—Plasma processing, 1999, [Internet web pages].
Article, "3D-ROM—A First Practical Step Towards 3D-IC", G. Zhang, Ph.D., *Cahners Semiconductor International*, Jul. 2000 [Internet web pages].

(Continued)

*Primary Examiner*—Fernando L Toledo
(74) *Attorney, Agent, or Firm*—Brinks Hofer Gilson & Lione (57) ABSTRACT

A high density plasma oxidation process is provided in which a dielectric film is formed having a predetermined thickness. Plasma oxidation conditions are provided such that the growth rate of the dielectric film is limited in order to produce dielectric layer having a precise thickness and uniformity. The high density plasma oxidation process can be used to fabricate gate oxide layers, passivation layers and antifuse layers in semiconductor devices such as semiconductor memory devices and multi-level memory arrays.

88 Claims, 7 Drawing Sheets

OTHER PUBLICATIONS

Article, "Improving IC Yield with Protective Ceramics", G. Zhang, Ph.D., *IBM® Journal of Research & Development*, Jun. 2000, pp. 217-220.

Article, "High-Density Plasma Chemical Vapor Deposition Of Silicon-Based Dielectric Films for Integrated Circuits," *IBM® Journal of Research & Development*, 1999, S.V. Nguyen, [Internet web pages].

Article, "Highly Reliable Ultrathin Silicon Oxide Film Formation at Low Temperature by Oxygen Radical Generated in High-Density Krypton Plasma," Sekine et al., *IEEE Transactions on Electron Devices*, vol. 48, No. 8, Aug. 2001.

Article, "A Novel High-Density Low-Cost Diode Programmable Read Only Memory," de Graaf et al., 1996 IEEE, *IEDM* 96-189-192.

* cited by examiner

PROCESS FOR FABRICATING A DIELECTRIC FILM USING PLASMA OXIDATION

RELATED APPLICATIONS

Related subject matter is disclosed in co-pending, commonly-assigned patent application Ser. No. 09/814,727 filed Mar. 21, 2001, entitled "Three-Dimensional Memory Array and Method of Fabrication" the disclosure of which is incorporated by reference herein.

Related subject matter is also disclosed in commonly-assigned patent application entitled, "Anti-Fuse Memory Cell With Asymmetric Breakdown Voltage," Ser. No. 09/918,307, filed Jul. 30, 2001.

FIELD OF THE INVENTION

The invention relates, generally, to plasma processing and, more particularly, to oxidation processes for the fabrication of dielectric films, in semiconductor devices.

BACKGROUND

Plasma processing is widely used in the semiconductor industry for the fabrication of semiconductor devices. Both deposition and etching processes and have been extensively developed that utilize a plasma to create activated atoms and molecules. Plasma processing offers several advantages to more conventional deposition and etching techniques. For example, plasma deposition or growth processes are typically carried out at lower process temperatures than corresponding thermal reaction deposition or growth processes. The relatively low process temperatures allow the high reliability fabrication of semiconductor devices that are sensitive to excess thermal processing, such as shallow junction devices and the like. In particular, conventional thermal oxidation processes are typically carried out at temperatures that are high enough to establish a high reaction rate between oxygen and the substrate being oxidized. Often, the thermal oxidation temperature is high enough to cause unwanted diffusion of dopants in the substrate.

To avoid the high temperatures associated with thermal oxidation, plasma oxidation processes have been developed. Plasma oxidation processes are typically carried out at temperatures below about 600° C. In comparison, a convention thermal oxidation process used to form, for example, silicon dioxide is typically carried out at temperatures in excess of 900° C. By using a plasma oxidation process, diffusion of dopants in the substrate is greatly reduced, which enables the formation of the shallow junctions necessary for high-speed devices.

As the need to fabricate smaller memory devices grows, vertically structured memory cells have been developed to enable higher packing densities. The vertically structured memory devices incorporate memory cells disposed at numerous levels above a substrate. In one such device, each level includes a plurality of spaced-apart first conductors extending in one direction, which are vertically separated from a plurality of parallel spaced-apart second conductors in a second direction, for example, extending perpendicular to the first conductors. Memory cells are disposed between the first conductors and the second conductors.

The memory cells of a vertically structured array are programmed by rupturing an antifuse located in each cell. One particular kind of antifuse is fabricated by forming an oxide layer between two semiconductor layers. For proper functioning of the memory array, the antifuses need to be precisely fabricated to insure that they respond alike to an applied rupture current. Because p/n diodes are typically used in close proximity to the antifuses, excessive oxidation temperatures are undesirable.

In addition to antifuses, thermal oxidation is commonly used to form a gate oxide layer in metal-oxide-semiconductor (MOS) transistors. The gate oxide layer must be of high quality and of precise thickness to insure proper operation of the transistor.

One particular problem of plasma oxidation relates to the difficulty of controlling the oxidation process to the exacting requirements needed for critical oxide formation. The fabrication of critical oxide layers, such as antifuses, gate oxide layers and the like requires precise thickness control and precise thickness uniformity. Accordingly, improved plasma processing techniques are necessary to enable the fabrication of critical oxide layers using plasma oxidation.

BRIEF SUMMARY

In accordance with a preferred embodiment of the invention, a high-density plasma (HDP) oxidation process is provided that can be used to form an oxide layer having a precisely controlled thickness. In one embodiment, the plasma oxidation process includes exposing an oxidizable surface to an oxidizing plasma, wherein the oxidizing plasma has an activity relative to the oxidizable surface. An oxide film is formed on the oxidizable surface and the oxidizing plasma activity is regulated to limit the rate of formation of the oxide film. By regulating the oxidizing plasma to limit oxidation rate, enhanced control over the thickness and uniformity of the oxide film is obtained.

The HDP oxidation process of the invention can be advantageously used to form a variety of dielectric structures in a semiconductor device. For example, the process can be used to form a gate oxide layer in an MOS transistor, an antifuse layer in a memory device, a passivation layer and the like. The dielectric material formed by the plasma oxidation process can be an oxide layer, such as a silicon oxide, or a composite dielectric material, such as a silicon oxide in combination with a silicon nitride material. A composite dielectric layer can be formed, for example, by introducing nitrogen during the oxide growth phase of the plasma oxidation process to form an oxynitride layer, or by forming a nitride layer overlying a plasma oxide layer. Further, the dielectric material formed in accordance with the invention can include other elements, such as carbon and the like, that are introduced during the plasma oxidation process.

In one embodiment, a dielectric film is formed by exposing an oxidizable surface to a plasma oxidation process for an initial exposure time and growing an oxide film on the oxidizable surface. The plasma process can be configured such that the oxide film grows to a predetermined thickness substantially independent of any exposure time beyond the initial exposure time. The process includes forming a semiconductor layer and exposing the semiconductor layer to a plasma that includes oxygen. The plasma has an activity relative to the semiconductor layer. An oxide film is formed on the semiconductor layer while regulating the plasma in order to limit the rate of formation of the oxide film.

In another embodiment of the invention, a dielectric rupture element in a semiconductor device is provided. The process includes forming a first semiconductor layer of a first conductivity type and subjecting the first semiconductor layer to a high density plasma that includes oxygen. An oxide antifuse layer is formed on the first semiconductor layer and a second semiconductor layer having a second conductivity type is formed in contact with the oxide antifuse layer. Then, a voltage potential is applied across the oxide antifuse layer sufficient to create an electrical current path between the first and second semiconductor layers.

In accordance with yet another embodiment of the invention, a process is provided for forming a cell in a memory device that includes an antifuse layer. The process includes, forming a first electrically conductive layer and forming a first semiconductor layer of a first conductivity type overlying the first electrically conductive layer. An antifuse layer is formed on the first semiconductor layer using a high density plasma oxidation process and a second semiconductor layer of a second conductivity type is formed to overlie the antifuse layer. Then, a second electrically conductive layer is formed to overlie the second semiconductor layer.

In accordance with a still further embodiment of the invention, a process is provided for fabricating a multi-level memory array. The process includes, forming a conductive layer and forming a semiconductor layer doped with a first conductivity type dopant on the conductive layer. Then, a plurality of spaced-apart rail-stacks are defined, while leaving a space between the rail-stacks. The space between the plurality of spaced-apart rail-stacks is filled with a dielectric material and a planarization process is carried out to form a planarized surface. Then, an antifuse layer having a predetermined thickness is formed on the planarized surface of the rail stacks using a high density plasma oxidation process.

The process of the invention can also be applied to the formation of passivation layers in a semiconductor device. For example, once the active device regions, such as the rail stacks of the memory have been patterned, the exposed surfaces of the rail can be passivated to limit leakage currents across these surfaces.

DETAILED DESCRIPTION OF PREFERRED EMBODIMENTS

The process of the invention can be carried out to form a number of different dielectric materials and a number of different dielectric films commonly used in semiconductor devices. In particular, the plasma oxidation process of the invention can be carried out on any oxidizable surface to which the plasma is exposed. Accordingly, the process of the invention can be carried out to form structures such as, a gate oxide layer during the fabrication of an MOS transistor, a dielectric antifuse layer, a passivation layer and the like. Although the process of the invention will be illustrated with respect to certain illustrative embodiments thereof, the invention is not intended to be limited to the illustrative embodiments. Those skilled in the art will appreciate that many dielectric materials can be formed on an oxidizable surface using the plasma oxidation process of the invention.

In the present invention, an improved dielectric layer having a uniform thickness is fabricated for use in a semiconductor memory device. The formation of a dielectric layer having a precisely determined thickness can improve the function of a semiconductor device by, for example, improving the reproduceabilty of the fabrication process.

In accordance with the invention, a silicon oxide layer is grown on the upper surface of a semiconductor layer at a precisely controlled oxidation rate. Control of the oxidation rate enables the oxide layer to be formed to a predetermined thickness, which can be on the order of only tens of angstroms. The oxidation rate control is provided by one or more methods to regulate the plasma activity at the surface of the semiconductor layer. The term "plasma activity" as used herein is intended to encompass any aspect of the plasma oxidation process, including but not limited to, reaction kinetics, growth initiation, surface energy and the like. Accordingly, the methods of the invention include both surface conditioning prior to presenting an oxidizable surface to the oxidizing plasma and adjustment of plasma gases and operating conditions before or during plasma oxidation, or both.

Although the process of the invention will be described in the context of the formation of an oxide layer on a silicon surface, those skilled in the art will recognize that the process can be applied to any oxidizable surface. Accordingly, the oxidation of all such surfaces is within the scope of the present invention.

To condition the oxidizable surface prior to oxide growth, the oxidizable surface can be bombarded with energetic ions. The energetic ions can be generated in a plasma within the HDP system and accelerated toward the oxidizable surface. The energetic ions can be any species capable of creating a sputtering action at the oxidizable surface. For example, the energetic ions can be relatively heavy inert ions, such as noble gas ions. Noble gas ions such as argon are substantially unreactive with the oxidizable surface, yet are energetic enough to condition the oxidizable surface. Alternatively, lighter inert gas ions, such as helium can also be used. In yet another alternative, combinations of noble gas ions such as Ar mixed with He can be used.

The ion bombardment process can remove any native oxides from the surface of the semiconductor layer. Further, the ion bombardment process can be carried out to facet or otherwise alter the topography of the surface of the semiconductor layer. By bombarding the surface, the reaction rate of oxidizing species with silicon atoms at the surface can be enhanced. In the instance where a dielectric rupture fuse is formed, faceting also enables the formation of an antifuse layer having highly reproducible rupture characteristics.

Precise control of the oxidation rate can be attained by adjusting the composition of the oxidizing plasma. For example, in addition to oxygen, substantial amounts of an inert gas, such as argon, helium, neon, xenon and the like, can be used to form the plasma. By diluting the plasma with an inert gas, fewer activated oxygen species are available at the oxidizable surface to react with silicon. By effectively starving the oxidizable surface of oxygen, a low oxidation rate is realized. Although any inert gas can be used, argon is a preferred diluent gas. The concentration of the inert gas can be adjusted during the plasma oxidation process to control the growth rate of the oxide film. For example, holding all other operating parameters constant while increasing the inert gas concentration relative to that of an oxidizing species will reduce the growth rate of the oxide layer.

In a further aspect of the invention, oxidizing plasma conditions are employed such that the growth of the oxide layer is self-limited to a predetermined thickness. To form silicon oxide, an oxidizing species of the plasma must diffuse from the plasma to the surface of silicon layer. At the surface, the oxidizing species reacts with silicon atoms to form a silicon oxide layer. By adjusting the operating parameters of the plasma system, the growth rate of the oxide layer can be made dependent upon the diffusion rate of the oxidizing species through the oxide layers previously formed on the surface of semiconductor layer 15.

Early in the oxidation process, the growth of the oxide layer is reaction rate limited, such that the growth rate is determined by the reaction rate of oxidizing species with silicon at the surface of the semiconductor layer. However, as the thickness of the oxide layer increases it takes progressively longer for the oxidizing species to diffuse through the oxide layer to reach the silicon surface. At some point, the diffusion of oxidizing species through the oxide layer becomes so slow that the growth of new oxide effectively ceases. Thus, the thickness of the oxide layer can be controlled through a self-limiting mechanism.

It is a particular advantage of the invention that additional exposure to the oxidizing plasma beyond some initial exposure time will not result in a significant further increase in oxide thickness. By creating a self-limiting oxide growth mechanism the oxide layer thickness can be made consistent from one substrate to the next. Also, the plasma oxidation process will not require excessive monitoring to insure that a precisely determined oxide thickness is obtained.

One means of establishing a self-limiting mechanism is by controlling the temperature of the oxidizable surface. As previously described, the high density plasma oxidation process is a relatively low temperature oxidation process. The temperature of the oxidizable surface can be further reduced, or regulated, by contacting the substrate with a cooling medium. The rate of cooling of the substrate can be adjusted relative to the power levels of the plasma to effectively control the oxidation rate at the oxidizable surface.

Additional control over the diffusion of oxidizing species can be obtained by controlling the energy of the plasma by adjusting the RF power level and bias power of the plasma system. In general, the more energetic oxidizing species will diffuse faster through the oxide layer and react more rapidly with the oxidizable surface. The energy level of the activated oxidizing species in the plasma can be further controlled by the application of a bias voltage to the substrate. A high bias voltage will accelerate ions in the plasma across the space charge region and impart high energy into the substrate and the growing oxide layer. High bias power also heats the substrate surface resulting in the enhanced diffusion of uncharged species and high growth rate.

Those skilled in the art will appreciate that excessive bias power will result in the sputtering of the dielectric material through bombardment by energetic ions from the plasma. This aspect of the process can be advantageously used to form a dielectric layer having a precisely determined thickness. For example, the sputter removal rate can be balanced with the oxidation growth rate to modulate the total dielectric film formation rate on the semiconductor substrate. This technique represents yet another aspect of providing a self-limiting oxidation process.

In addition to the foregoing, adjusting the concentration of oxidizing species relative to inert species in the plasma will affect the flux of activated oxidizing species through the oxide layer. Inert gas dilution levels in the plasma can be adjusted to limit the amount of oxidizing species that arrives at the surface of the oxide layer.

In the following description, the advantages of the inventive process will be described in the context of the fabrication of a vertically-stacked, field programmable, non-volatile memory device. Although the illustrated memory device typically contains several dielectric layers that can be enhanced by application of the inventive process, those skilled in the art will recognize that many different types of devices, such as volatile memory device, microprocessor, discrete devices, such as power transistors and the like, can also benefit from the inventive process.

Figure 1:
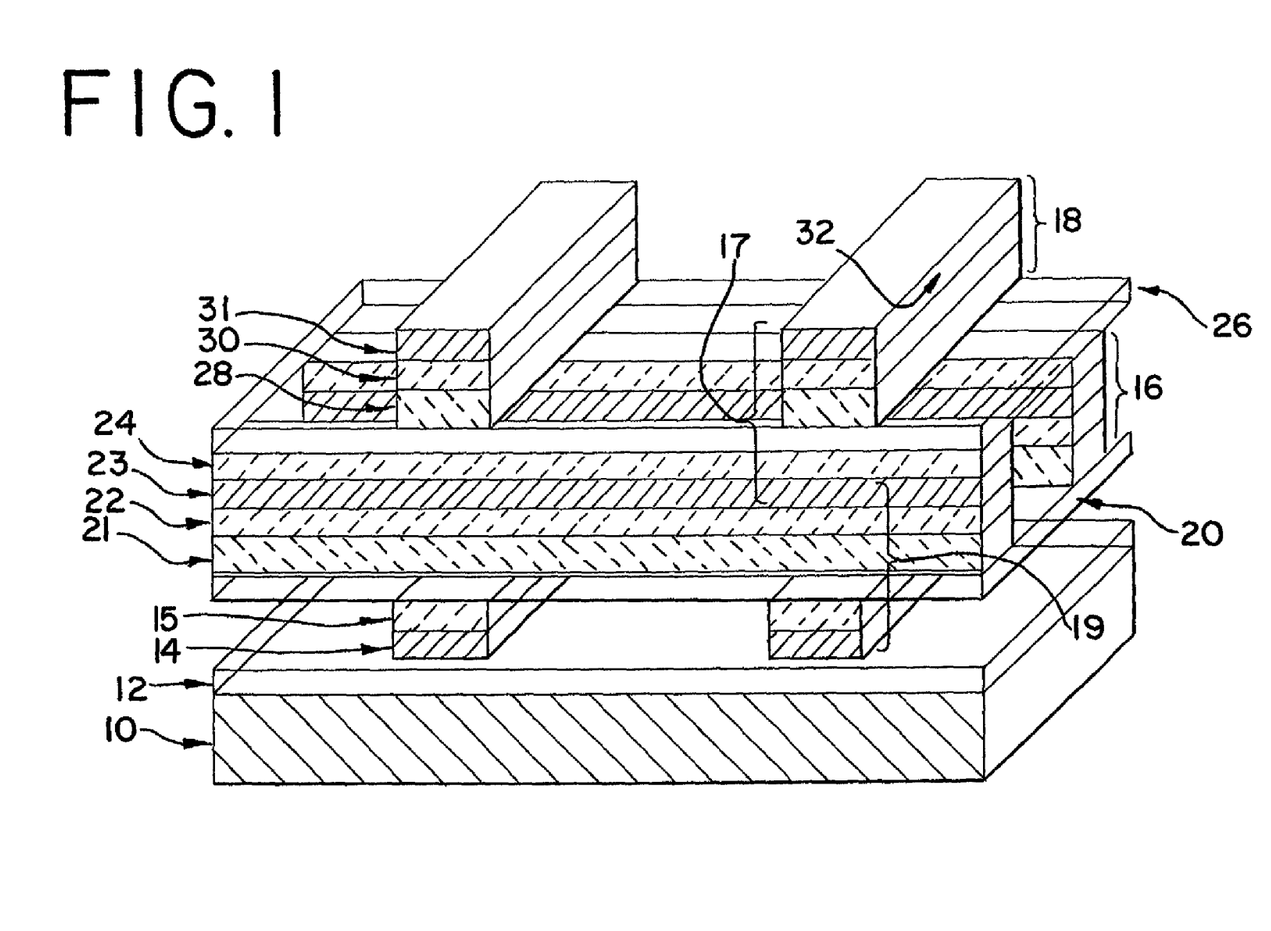
FIG. 1 illustrates a perspective view of a cut-away portion of a memory array including a dielectric antifuse fabricated in accordance with the invention.

One example of a vertically-stacked, field-programmable, non-volatile memory device fabricated in accordance with the inventive process is illustrated in FIG. 1. A perspective view of several rail-stacks of a three dimensional memory array is illustrated in partial cross-section. The array is fabricated on a substrate 10 which may be an ordinary monocrystalline silicon substrate. Decoding circuitry, sensing circuits, and programming circuits are fabricated in one embodiment within the substrate 10 under the memory array using, for instance, MOS fabrication techniques to fabricate MOS transistors and the like. (These, circuits may also be fabricated above the substrate.) Vias are used to connect conductors within the rail-stacks to the substrate to allow access to each rail-stack in order to program data into the array and to read data from the array. For instance, the circuitry within the substrate 10 may select rail-stack 16 and the rail-stack 18 in order to either program or read a bit associated with the intersection of these rail-stacks.

During fabrication of the MOS devices within the underlying circuitry in substrate 10, a plasma oxidation process is carried out to form gate oxide layers on the surface of substrate 10. In one embodiment, the surface is cleaned to remove any native oxide layers or debris, and a plasma oxidation process is performed to grow the gate oxide layers.

Once the underlying circuitry is formed, the data storage components of the memory device are fabricated above the circuitry. The memory array illustrated in FIG. 1 is fabricated on several levels and, for instance, may have eight levels of storage. Each level includes partially or completely a first plurality of parallel spaced-apart rail-stacks running in a first direction and a second plurality of rail-stacks or conductors (depending on the embodiment) running in a second direction. A rail-stack may be shared by two levels of storage. Generally, the first rail-stacks run perpendicular to the second conductors/rail-stacks and hence form a right angle at their intersections.

In the array illustrated in FIG. 1, several rail-stacks are shown in partial cross-section. For instance, rail-stack 16 is shown at one height and a half rail-stack 18 is shown at a second height above the first height. Also, half rail-stacks are disposed between rail-stack 16 and a substrate 10. These lower half rail-stacks run in the same direction as the half rail-stack 18. A bit is stored at the intersection of rail-stacks and, for instance, a "cell" is present between the rail-stacks and layers shown within the bracket 17 and another cell is within the bracket 19. Each of these brackets spans a memory level.

As shown in FIG. 1, an insulating layer 12 is formed over the substrate in order that the array may be fabricated above the substrate. This layer may be planarized with, for instance, chemical-mechanical polishing (CMP) to provide a flat surface upon which the array may be fabricated.

After planarizing insulating layer 12, a conductive layer 14 is formed on the substrate. As will be seen, conductive layers are used within the rail-stacks and these layers and the resultant conductors may be fabricated from elemental metals, such as tungsten, tantalum, aluminum, copper or metal alloys may be used such as MoW. Metal suicides may also be used such as $TiSi_2$, $CoSi_2$ or a conductive compound, such as TiN, WC and the like may be used. A highly doped semiconductor layer such as silicon is also suitable. Multiple layer structures may be used selecting one or more of the above.

Following the deposition of the conductive layer, a semiconductor material layer 15, such as silicon, is formed over the conductive layer. This is typically a polysilicon layer; however, an amorphous layer may be used. Other semiconductor materials may also be used, such as Ge, GaAs, and the like. In the array illustrated in FIG. 1, semiconductor layer 15 is highly doped and, as will be seen, forms one half a diode. After masking and etching steps, half rail-stacks are formed. These rail-stacks are "half" or partial rail-stacks since they are approximately half the thickness of the rail-stacks used in subsequent levels. A dielectric layer (not shown) is deposited to fill the area between the rail stacks.

Once semiconductor layer 15 is formed, in accordance with the invention, a plasma oxidation process is carried out to form an antifuse layer 20. Those skilled in the art will appreciate that a plasma oxidation process can grow a high-purity and uniformly-thick oxide layer. However, optimal quality often requires that the surface upon which the oxide layer is to be grown should be substantially free of particulate matter. Accordingly, in a preferred embodiment, the upper surface of semiconductor layer 15 is processed to remove contaminants prior to performing the plasma oxidation process. To prepare the surface of semiconductor layer 15, a CMP process is carried out to form a substantially uniform surface topography and to expose the upper surface of layer 15. Then, a brief chemical etching process is performed to remove any polishing debris from the surface. In one method, a wet chemical hydrofluoric acid (HF) dip is used to clean the surface.

Once the formation of an antifuse layer 20 is complete, the process of the invention continues with the formation of a full set of memory array rail-stacks on antifuse layer 20. This comprises first the deposition of a lightly doped silicon layer 21 doped with a conductivity type dopant opposite to that used for the silicon layer 15, a heavily doped silicon layer 22 doped also opposite to the layer 15, a conductive layer 23 and a heavily doped silicon layer 24 doped with the same conductivity type dopant as layers 21 and 22.

The section of the non-volatile memory device illustrated in FIG. 1 that includes silicon layer 15, antifuse layer 20 and silicon layer 21 forms a dielectric rupture element. When a voltage potential is applied of sufficient magnitude, antifuse layer 20 will breakdown and a current will flow from silicon layer 15 to silicon layer 21. Numerous dielectric rupture elements are fabricated in the non-volatile memory devices described herein. Although, presently illustrated in the context of a silicon device having rail-stacks, the dielectric rupture element can be used in a number of different memory structures and can be formed by other semiconductor layers, such as germanium and the like.

After masking and etching, the rail-stacks shown in FIG. 1, such as rail-stack 16 are formed. These rail-stacks are, as illustrated, in a direction perpendicular to the rail-stacks above and below them. While not shown in FIG. 1 but as will be described later, the spaces between the rail-stacks after they are defined, are filled with a dielectric such as silicon dioxide. Then the rail-stacks and fill are planarized by CMP. In another embodiment spin-on-glass (SOG) is used to fill the voids. In this case chemical planarization can be used such as, for example, plasma etching. Other fill and planarization methods can also be used.

After formation of the rail-stacks another antifuse layer 26 is formed. In accordance with the invention, the high density plasma oxidation process described above is used to form antifuse layer 26.

Now another layer of rail-stacks are defined and only half rail-stacks are shown in FIG. 1 at this upper level. This half rail-stack comprises a silicon layer 28 doped with a conductivity type dopant opposite to that of silicon layer 24. This is a lightly doped layer. Another silicon layer 30 is formed on silicon layer 28 and doped with the same conductivity type dopant as silicon layer 28. However, silicon layer 30 is more heavily doped than silicon layer 28. Then, a conductive layer 31 is formed on silicon layer 30.

Half rail-stacks are used at the very upper-most level of the array and at the very lowest level of the array. In between the half rail-stacks a number of full rail-stacks, such as rail-stack 16, are used throughout the array.

It should be noted that the silicon layers disposed on the conductive layers extend the entire length of the rail-stacks in the embodiment of FIG. 1 and are uninterrupted except possibly where vias are used to provide a conductive path to substrate 10.

In accordance with a preferred embodiment of the invention, dielectric layers are grown using a high-density-plasma (HDP) technique, however, this is not essential to the practice of the invention. As used herein the term "HDP" is intended to mean a plasma having an electron density of more than about $10^{11}$ electrons per cubic centimeter ($e/cm^3$). In an alternative embodiment, the process of the invention can be carried out in a plasma having a plasma density below $10^{11}$ $e/cm^3$.

Several existing plasma systems have the capability of generating an HDP, including systems such as an "Ultima Centura" from Applied Materials, Inc. (Santa Clara, Calif.), a "Speed" from Novellus Corp (San Jose, Calif.) and the like. A distinct advantage of the HDP technique is that the plasma oxidation process can be carried out at relatively low temperatures. Low temperature processing avoids the unwanted diffusion of dopants already present in the substrate and the premature recrystallization of semiconductor materials. A further advantage of the HDP technique is the ability to control the thickness and uniformity of the oxide layer compared with conventional oxidation techniques. In accordance with the dielectric growth regulating aspect of the invention, uncontrolled growth can be prevented by avoiding inadvertent exposure of the oxidizable surface to an oxidizing plasma during substrate loading operations.

Figure 2:
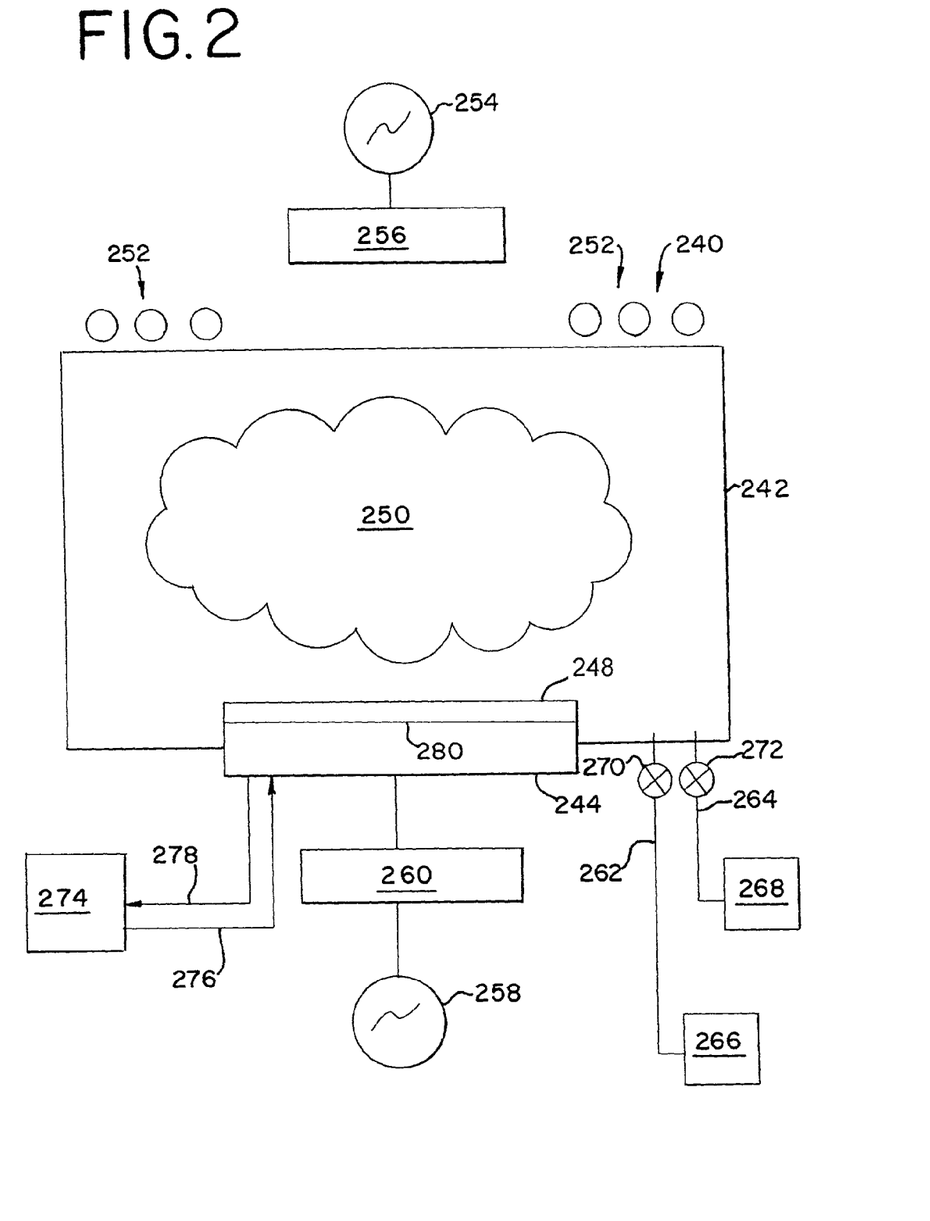
FIG. 2 is a schematic diagram of a high density plasma oxidation system suitable for use with the present invention.

A schematic diagram of an exemplary HDP system 240 is illustrated in FIG. 2. HDP system 240 includes a plasma chamber 242 in which a substrate platen 244 is positioned. A substrate 248 resides on platen 244 and is subjected to energetic oxidizing species from a plasma 250 created within plasma chamber 242. Inductive coils 252 are disposed about a portion of plasma chamber 242. An RF power supply 254 inductively couples RF energy to plasma 250 through a matching network 256 and inductive coils 252.

Platen 244 is independently coupled to an RF power supply 258 through a matching network 260. Accordingly, an RF bias can be applied to substrate 248 independent of the RF power applied to plasma 250.

Plasma chamber 242 is plumbed with gas lines 262 and 264 that couple gas supplies 266 and 268, respectively, to plasma chamber 242. In the exemplary HDP system illustrated in FIG. 2, gas supply 266 contains sources of oxidizing gases and gas supply 268 contains sources of inert gases. Mass flow controllers 270 and 272 regulate the flow of gas through gas lines 262 and 264 from gas supplies 266 and 268, respectively. Accordingly, the flow of oxidizing gas species and inert gas species into plasma chamber 242 can be independently controlled. In an alternative method, the oxidizing gas can be pre-mixed with the inert gas and be supplied from a common gas supply.

A cooling medium can be circulated through platen 244 by supplying a cooling medium from a cooling supply 274 through recirculation lines 276 and 278. Any of a number of cooling media can be used to cool platen 244, including helium and gas or liquid refrigerants and the like. The temperature of substrate 248 can be controlled by conductive heat transfer though a back side 280 of substrate 248. To facilitate heat transfer from substrate 248, platen 244 includes an electrostatic substrate clamping mechanism to tightly hold substrate 248 against the platen. Additionally, helium or other gas can be introduced between the platen and the wafer to further enhance the heat transfer between the platen and the wafer. The pressure of this gas can also be modulated to control the heat transfer. Accordingly, it is within the scope of the present invention to cool the backside of the wafer directly in addition to or in the place of cooling the platen.

In addition to the features illustrated in FIG. 2, exemplary HDP system 240 can also include plasma focusing subsystems to increase the density of plasma 250.

In a preferred embodiment, an inert gas plasma is ignited in plasma chamber 242 and substrate 248 is placed in plasma chamber 242. The inert gas plasma is preferably a plasma formed by a mixture of argon and helium. Alternatively, the inert gas plasma can be either argon or helium, or other noble gases. Then, RF bias power is applied from RF power supply 258 and the surface of substrate 248 is bombarded with energetic species from the argon/helium/noble gas plasma. As described above, the bombardment process sputters away residual oxide layers and debris from the surface of semiconductor layers present on the surface of substrate 248. Furthermore, the bombardment process facets the semiconductor surfaces in preparation for plasma oxidation.

Those skilled in the art will recognize that a wide variety of power levels can be applied depending upon several factors, including the particular material structure to be oxidized, the desired energy level of bombarding species and the like. For example, where the semiconductor material is silicon, in the exemplary HDP system shown in FIG. 2, an RF bias power of preferably about 800 W to about 1200 W and, more preferably, about 1000 W is applied. The bombardment process is carried out for preferably about 8 to about 12 seconds and, more preferably, for about 10 seconds.

After the initial sputtering process is complete, oxidizing gases are introduced into plasma chamber 242 to form an oxidizing plasma. Those skilled in the art will appreciate that an oxidizing plasma can be formed using a number of oxidizing species, such as oxygen, ozone, nitrous oxide and the like. Further, the oxidizing species can be mixed with inert gases, such as argon, helium and the like.

In a preferred embodiment, an oxidizing plasma is formed using a mixture of oxygen and argon gas. In accordance with the invention, the oxide growth rate can be regulated by diluting the oxygen concentration. Preferably, mass flow controllers 270 and 272 are activated and a relatively high dilution ratio is obtained by flowing about 40 to about 60 standard-cubic-centimeters-per-minute (sccm) of oxygen and, more preferably, about 50 sccm of oxygen, and about 400 to about 600 sccm of argon and, more preferably, about 500 sccm of argon into plasma chamber 242. Those skilled in the art will recognize that the dilution ratio of oxygen to diluent gas will vary depending upon the chamber geometry, the operating parameters of the particular HDP system and the like.

The dilute plasma is energized by applying RF power from RF power supply 254 using a power level of preferably about 1500 W to about 2500 W and, more preferably, about 2000 W. In the preferred oxidation process, no RF bias power is applied during the oxide growth phase. However, in accordance with the invention, a small amount of RF bias power can be applied as necessary to further reduce the oxide growth rate. Further, as described above, additional plasma focusing methods, such as magnetic energy, can be applied during the oxide growth phase to control the oxide growth rate. To cool substrate 248 during oxidation, a helium gas pressure of preferably about 6 to about 10 torr and, more preferably, about 8 torr is provided between the wafer and the platen to enhance the heat transfer.

In accordance with the invention, a dielectric film having an oxynitride composition can be formed by introducing nitrogen or a nitrogen-containing compound during the oxidation process. For example, about 10 sccm to about 20 sccm of nitrogen can be feed into plasma chamber 242 from gas supply 268. Alternatively, a nitrogen-containing compound such as ammonia ($NH_3$), nitrous oxide ($N_2O$) and the like can also be used. The oxynitride process can also be used to form an oxynitride region at the surface of a previously grown silicon oxide layer. For example, the plasma process of the invention can also be carried out to nitridize a previously-grown silicon oxide surface. In this case, rather than form a uniform oxynitride layer having a uniform composition, nitrogen is introduced into the upper surface of the silicon oxide layer to form an oxynitride region at the silicon oxide surface.

In a further embodiment, a layer of silicon nitride can be formed over a silicon oxide layer. In this process, once the silicon oxide layer is formed, process gases are introduced into plasma chamber 242 to form a silicon nitride layer. For example, a silicon nitride layer can be formed by introducing silane or dichlorosilane and ammonia or nitrogen to form a plasma deposited layer of silicon nitride. Those skilled in the art will recognize that other silicon nitride forming process are possible, such as chemical-vapor-deposition (CVD) and the like. Accordingly, other types of silicon nitride forming processes are within the scope of the present invention.

In an alternative embodiment, a pre-oxidation step using a nitrogen-containing plasma can be carried out before growing a silicon oxide or an oxynitride layer. For example, the substrate can be subjected to a plasma preconditioning step using nitrogen or a nitrogen-containing compound, such as nitrous oxide, ammonia and the like for a brief period prior to commencing the dielectric growth process.

In yet another embodiment, the dielectric layer is formed to include other elements, such as carbon. The inclusion of carbon in the dielectric film can be accomplished by, for example, introducing methane ($CH_4$) or other hydrocarbon gas into plasma chamber 242 during the oxidation process. For example, about 10 sccm to about 200 sccm of methane can be introduced during the oxidation process.

Figure 3:
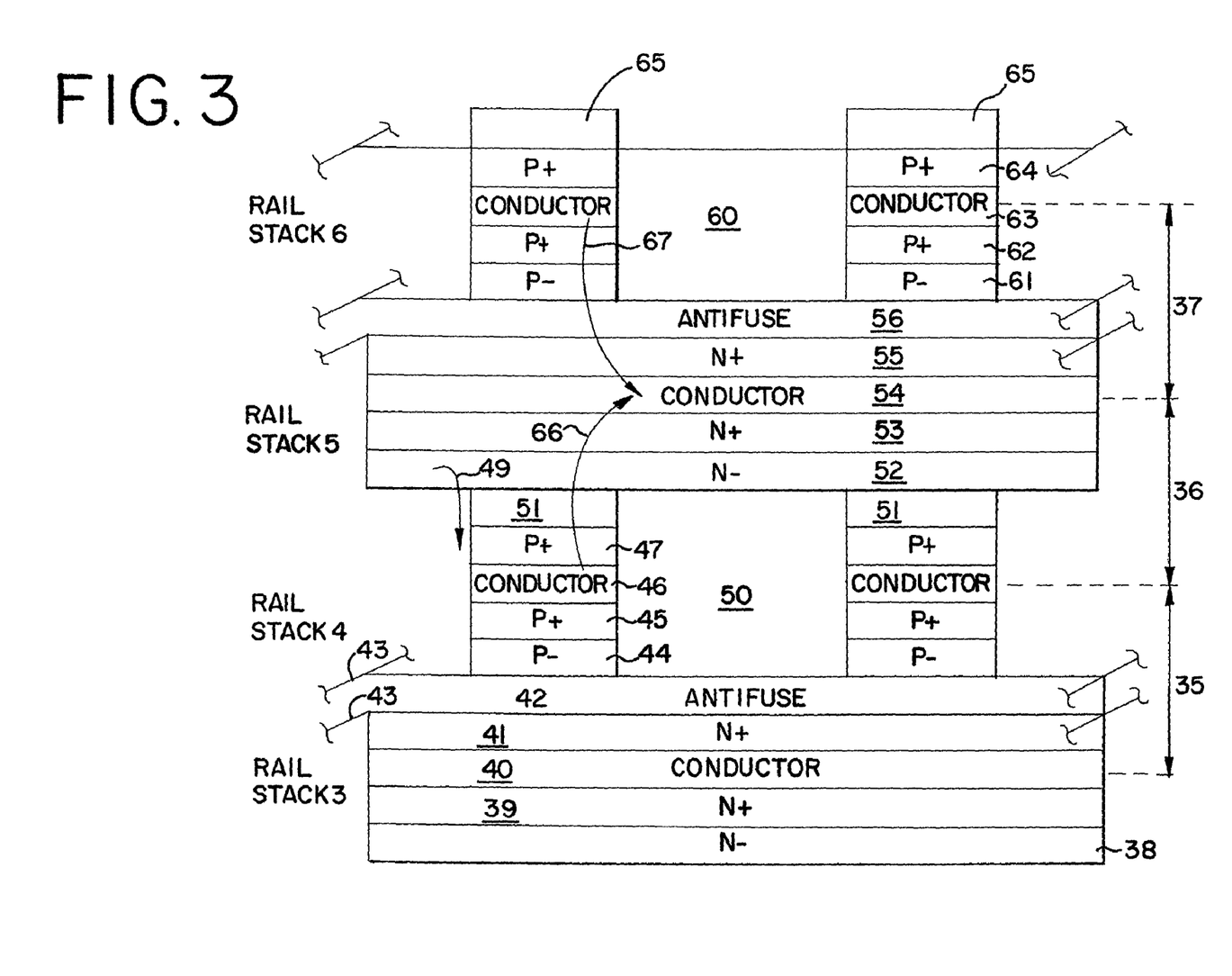
FIG. 3 illustrates a cross-sectional elevation view of a memory array fabricated in accordance with the invention.

In the cross-sectional view of FIG. 3, one embodiment of a memory device is illustrated that corresponds to the embodiment shown in FIG. 1. In FIG. 3, the half railstacks of FIG. 1 are not illustrated. Instead, three complete cells 35, 36 and 37 of the array are illustrated in FIG. 3. The three cells are located between a lower silicon layer 38 and an upper antifuse layer 65. Although not illustrated in FIG. 3, other rail-stacks or half rail-stack can be formed below silicon layer 38 of FIG. 3. Also, full or half rail-stack can be formed above antifuse layer 65.

The rail-stack 3 comprising layers 38 through 41 include a lightly doped n− semiconductor layer 38, a heavily doped n+ semiconductor layer 39, a conductor layer 40 and an n+ semiconductor layer 41. The fabrication of these rail-stacks will be discussed in more detail in conjunction with FIG. 4A through FIG. 4G. An antifuse layer 42 covers all of the rail-stacks formed below layer 42. In accordance with the invention, antifuse layer 42 is formed using the HDP oxidation process described above. An additional dielectric layer is deposited to fill the voids between the rails.

It should be noted that n+ semiconductor layers sandwich conductor layer 40. These highly doped layers provide ohmic transitions to prevent unintended Schottky diode formation. The layers above and below conductor 40 are not symmetrical for the embodiment illustrated in that n− semiconductor layer 38 is used below conductor layer 40 and not above conductor layer 40. Only a single lightly doped layer (in conjunction with a heavily doped layer) is needed to define a diode; the thickness of this lightly doped layer is important in controlling the break-down voltage and resistance of the diode so formed. Semiconductor layer 41 and the dielectric fill layer are planarized after the rail-stacks are defined and then an HDP oxidation process is carried out to form an antifuse layer 42 semiconductor layer 41. As previously described, a wet chemical etch can also be carried out to clean the surface of semiconductor layer 41 prior to the HDP oxidation process. (The lines 43 in FIG. 3 are used to indicate that antifuse layer 42 and like layers are not etched with the rail-stack below it and thus extend over the entire surface of the underlying semiconductor layer in the illustrated embodiment.)

A rail-stack 4, comprising semiconductor layers 44, 45, conductor layer 46 and semiconductor layer 47, is formed on antifuse layer 42. In the embodiment illustrated in FIG. 3, semiconductor layer 44 is lightly doped with a p− type dopant and semiconductor layers 45 and 47 are more heavily doped with a p− type dopant. After these layers are deposited, they are masked and etched to define the rail-stacks. Then, the voids between these rail-stacks, such as void 50, are filled with a dielectric. The dielectric fill is planarized along with a portion of p+ semiconductor layer 47. Planarization is done at this point in the fabrication since there is generally poor control over the thickness and contour of the dielectric fill. The fill tends to build up on the rail-stacks when a non-spin-on type deposition is used. In accordance with the invention, antifuse layer 51 is formed using the HDP oxidation process described above.

The process is now repeated to form rail-stack 5, this time beginning with an n− semiconductor layer 52 followed by an n+ semiconductor layer 53, a conductive layer 54 and n+ semiconductor layer 55. Again after defining the rail-stacks 5, the voids are filled and the surface is planarized. In accordance with the invention, another antifuse layer 56 is formed using the HDP oxidation process described above.

The process is repeated for rail-stacks 6, this time beginning with a p− semiconductor layer 61, p+ semiconductor layer 62, conductive layer 63, p+ semiconductor layer 64. Again after defining the rail-stacks, filling the void 60 with a dielectric layer and then planarizing, another antifuse layer 65 is formed using the HDP oxidation process described above.

It should be noted that with the reversal of the p− and n− layers at each successive rail-stack, planarization for this embodiment always occurs on a heavily doped layer, such as semiconductor layer 47 and semiconductor layer 55. Moreover, the lightly doped layers are always formed on relatively planar surfaces, consequently their thickness can be more easily controlled. This, as mentioned, allows the characteristics of the diode (once the intermediate antifuse layer is breached) to be more reliably controlled.

The process flow for forming rail-stack 5 of FIG. 3 is illustrated in FIGS. 4A-4H. It will be apparent that the rail-stacks for the other embodiment (FIGS. 5 and 6) are similarly processed.

Figure 4A:
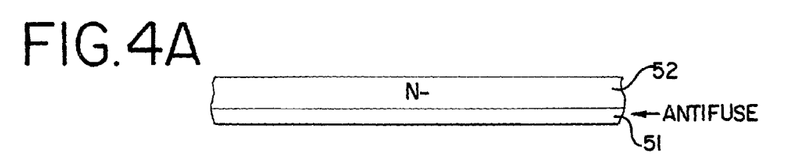
FIGS. 4A-4H illustrate, in cross-section, process steps in accordance with one embodiment of the invention for fabrication of the memory array illustrated in FIG. 3.

First, as shown in FIG. 4A an antifuse layer 51 is formed. Preferably, about 15 Å to about 200 Å of silicon dioxide is formed by the HDP oxidation process described above. Although shown as a continuous layer, as previously described, the HDP process oxidizes only the silicon material of underlying p+ semiconductor layer 47. Following the formation of antifuse layer 51, semiconductor layer 52 is deposited, which is typically about 1000 to about 4000 Å thick and preferably formed by a CVD process. In the CVD process, a phosphorous dopant is deposited along with the deposition of for instance, the polysilicon semiconductor material. Alternatively, after carrying out the CVD process, dopant ions can be ion implanted into semiconductor silicon layer 52. Preferably, semiconductor layer 52 is doped to a level of, for example, about $1 \times 10^{17}/cm^3$, but can be doped to a level in a range from about $1 \times 10^{15}/cm^3$ to about $1 \times 10^{19}/cm^3$.

Figure 4B:
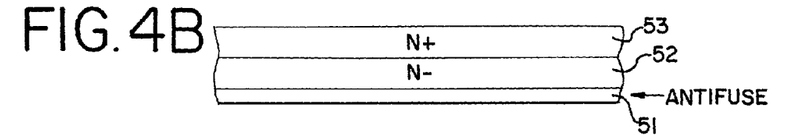

Now, as shown in FIG. 4B, n+ semiconductor layer 53 is deposited again using a CVD process. This layer may be approximately 300 to approximately 3000 Å thick, and, in one embodiment, is doped to a level of greater than about $10^{19}/cm3$.

In accordance with the disclosed embodiment, two adjacent semiconductor layers are often shown with different doping levels, such as semiconductor layers 52 and 53. These layers may be formed with one deposition and using ion implantation steps at two different energy levels to obtain the desired two doping levels. Also, the variation in doping concentration of semiconductor layers 52 and 53 may be obtained by introducing different amounts of dopant in a diffusion process as a layer is formed.

Figure 4C:
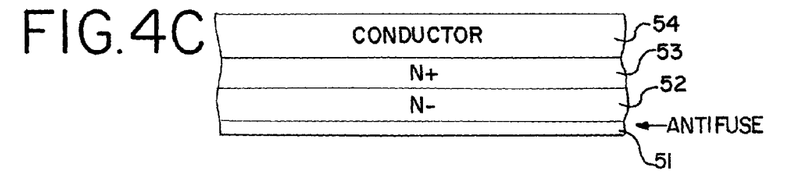

Referring to FIG. 4C, a conductive layer 54, which may be about 500 to about 1500 Å thick, is formed using any one of numerous well-known thin film deposition processes, such as sputtering and the like. The conductive layer can be a refractory metal or a refractory metal silicide. Also as mentioned aluminum or copper can be used, or more simply the heavily doped silicon can be the conductor. In one embodiment, Ti and TiN layers are formed on the silicon layer and the wafer is heated to form a silicide. For instance, a Ti layer of about 250 Å and a TiN layer of about 70 Å are heated at about 600° C. for about one minute to form the silicide.

Figure 4D:
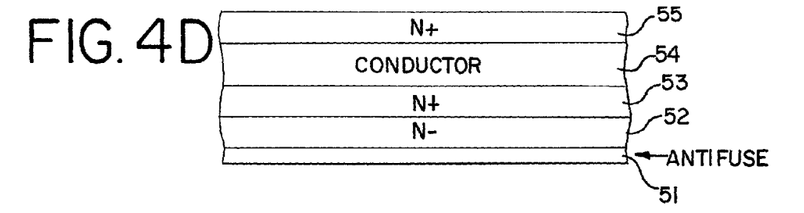

Next, as illustrated in FIG. 4D, another semiconductor layer 55 composed of, for instance, polysilicon approximately 1500 to approximately 2000 Å thick is formed and again doped to a level of greater than about $10^{19}/cm^3$. After the planarization process that is carried out to prepare semiconductor layer 55 for the subsequent HDP oxidation process, its thickness is reduced to about 300 Å to about 2000 Å.

Figure 4E:
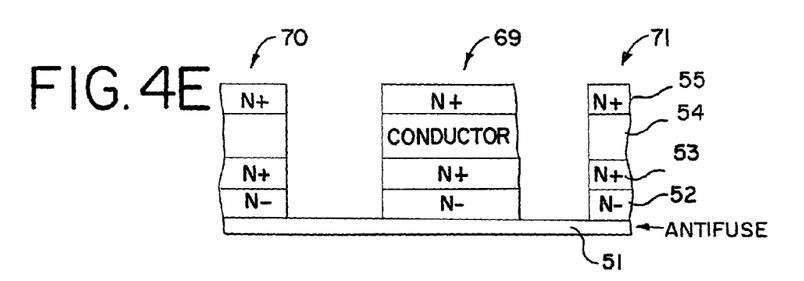

A masking and etching step is now used to define rail-stacks, such as rail-stacks 69, 70 and 71 shown in FIG. 4E. Note that when comparing this view to the view of rail-stack 5 of FIG. 3, the view in FIG. 4E is taken from the side and consequently shows the individual rail-stacks. To form the rail-stacks, conventional photolithographic masking and etching processes can be used, including, for instance, plasma etching. Etchants can be used that stop on antifuse layer 51 and deposited dielectric material described above, thus preventing this layer from being etched away. Thus, antifuse layer 51 and the deposited dielectric material can be considered an etchant stop layer depending on the specific etchants used.

Figure 4F:
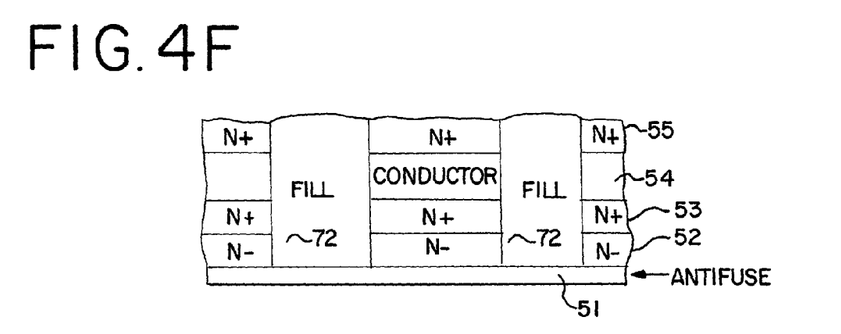
Figure 4G:
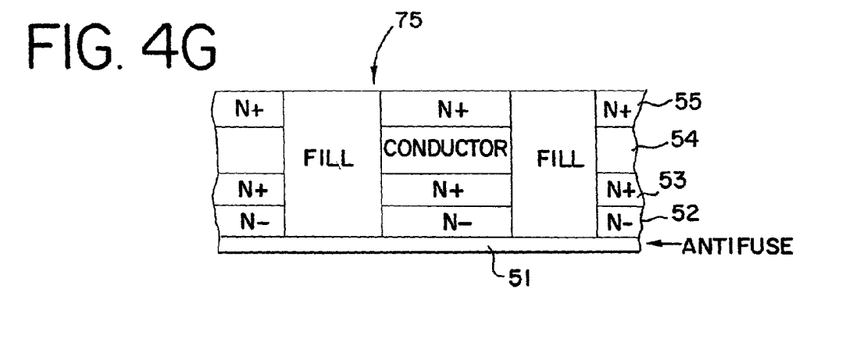

Next, as shown in FIG. 4F, the spaces between the rail-stacks are filled with a dielectric material. The dielectric material can be deposited by several dielectric deposition techniques, including a high-density-plasma-chemical-vapor-deposition (HDPCVD) process. Alternatively, in accordance with the invention, the previously-described plasma oxidation process can be used to form a passivation layer on the rail stacks. The fill material can also act as a passivation film. The fill layer directly overlies oxidizable surfaces and, as such, the inventive plasma oxidation process can be advantageously used to form a portion of the fill layer illustrated in FIG. 4F. After depositing the dielectric fill, in one embodiment, a CMP process is employed to planarize the upper surface of the rail-stacks, as shown in FIG. 4G. Chemical etching can also be used as mentioned with certain dielectrics. The planarization process can reduce the thickness of semiconductor layer 55 to approximately 500 Å, thus this layer can be approximately the same thickness as semiconductor layer 53.

Figure 4H:
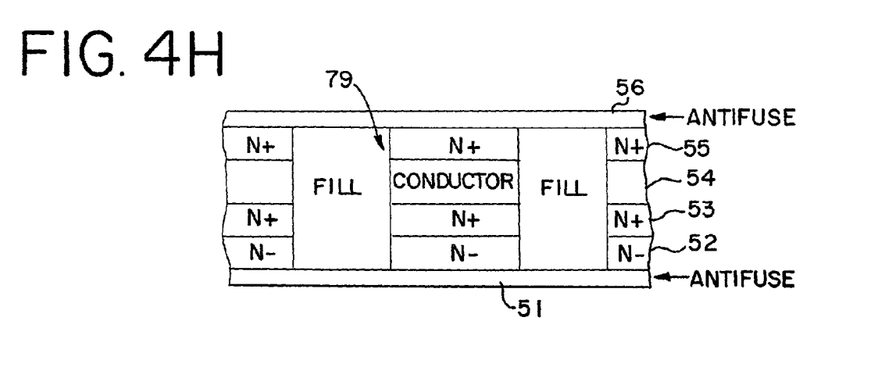

Next, as shown in FIG. 4H, another antifuse layer 56 is formed on the planarized surface 75. In accordance with the invention, antifuse layer 56 is formed using the HDP oxidation process described above.

It should be noted that in FIG. 3, while the antifuse layer is shown as a blanket layer covering the rail-stacks and fill, in accordance with the invention, on each level the antifuse layer is grown from an underlying semiconductor layer. For example, in the case where semiconductor layers are silicon layer, the previously described HDP oxidation process is used to grow a silicon dioxide layer from layers 41, 47, 55 and 64.

In all the embodiments, the rail-stacks and rails are connected to circuitry in the substrate, such as decoders, sense amps and similar peripheral circuits. Vias for providing these connections are described in copending, commonly-assigned patent application Ser. No. 09/746,341, entitled "Contact and Via Structure and Method of Fabrication," the disclosure of which is incorporated by reference herein.

Figure 5:
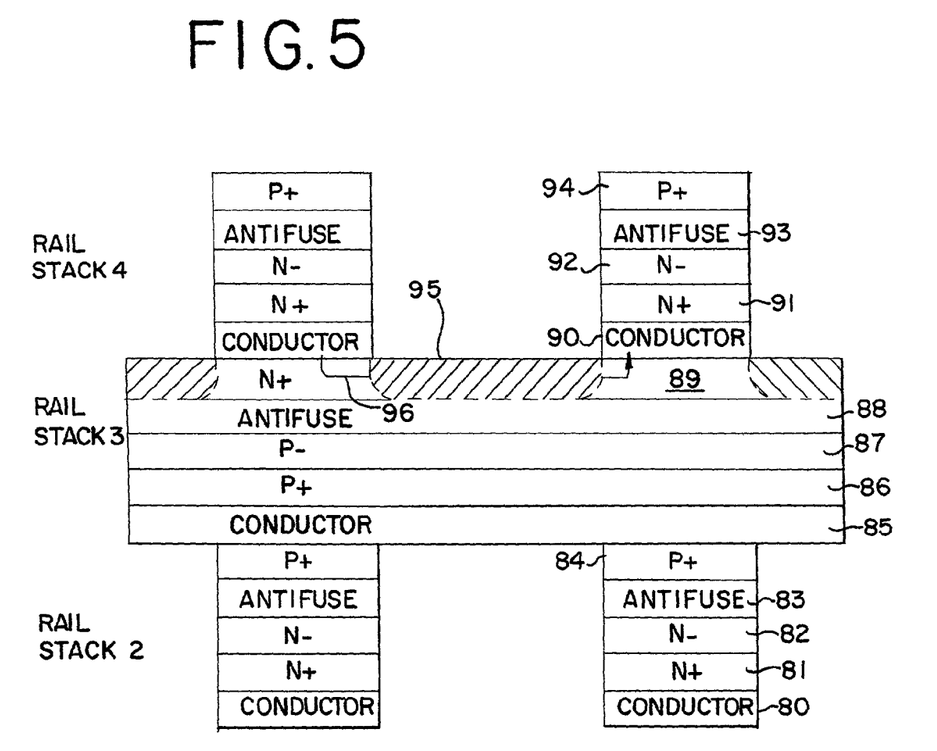
FIG. 5 illustrates a cross-sectional elevation view of another memory array fabricated in accordance with the invention.

In the memory array illustrated in FIG. 5, each rail-stack begins with a conductor such as conductor layer 80. An n+ semiconductor layer 81 and an n− semiconductor layer 82 are formed on conductor layer 80. Next, in accordance with the invention, an antifuse layer 83 is formed using the HDP oxidation process described above. Then, a p+ semiconductor layer 84, which can be silicon doped with boron, is deposited on antifuse layer 83. When the rail-stacks are formed, such as rail-stack 2, antifuse layer 83 is etched as well as layers 80, 81, 82 and 84.

The voids between the rail-stacks are now filled and a planarization process is performed to planarize the fill with the upper surface of semiconductor layer 84. Following the completion of rail-stack 2, rail-stacks 3 are formed, as shown in FIG. 5. Rail-stacks 3 comprise a conductor layer 85, p+ semiconductor layer 86, p− semiconductor layer 87, antifuse layer 88 and n+ semiconductor layer 89. Again, masking and etching processes are carried out to pattern the rail-stack. The etching process also etches the exposed regions of semiconductor layer 84, which does not appear in the view of FIG. 5, but this will be apparent shortly when region 95 of the next stack is discussed. After forming rail-stacks 3, filling and planarization steps are carried out and rail-stacks 4 are formed. Rail-stacks 4 comprise a conductive layer 90, n+ semiconductor layer 91, n− semiconductor layer 92, antifuse layer 93, and p+ semiconductor layer 94. Once masking, etching, filling and planarization steps are carried out.

Unlike the fabrication process for the memory array illustrated in FIG. 3, here, when rail-stacks at any particular height are formed, etching must occur on one layer of the rail-stack immediately below the rail-stack being defined. For instance, when rail-stack 4 is etched semiconductor layer 89 of rail-stack 3 is etched away where it is not covered by rail-stack 4 as shown by shaded region 95. The etching process is used to remove all of the semiconductor material between the adjacent conductors, and, consequently, prevents a possible current path, such as path 96, shown in FIG. 5.

In similarity with the process embodiment described above, antifuse layer 88 can optionally be used as an etchant stop. No harm is done if etching does occur through the portions of antifuse layer 88 away from the intersection of the rail-stacks, since the antifuse layer is only needed at the intersections of the rail-stacks. Because the process is self-aligned, the etching of region 95 is in alignment with overlying rail-stacks and consequently no additional masking is required.

Consistent with the memory array of FIG. 3, the order of the n and p doped semiconductor layers alternate with each successive rail-stack. Moreover, the rail-stacks at any given level include both p and n semiconductor layers. In contrast with the memory array of FIG. 3, at any particular level, the rail-stacks shown in the memory array of FIG. 5 are doped with either an n type or p type dopant, but not both.

Some of the memory arrays described above have both p−n+ and p+n− diodes. In some processes, one of these diodes may exhibit more leakage than the other. Consequently, it may be desirable to have an array with only a single kind of diode. For example, an array may have higher leakage with diodes that are p−n+ type than with diodes of the p+n− type.

Figure 6:
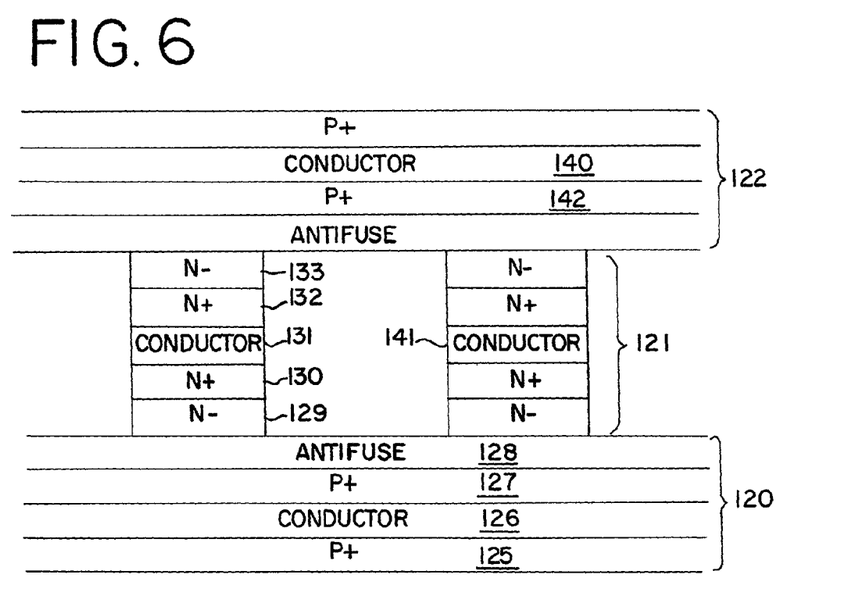
FIG. 6 illustrates a cross-sectional elevation view of a yet another memory array fabricated in accordance with the invention.

FIG. 6 illustrates a memory array where, if the antifuse layer is breached, all the diodes will be p+n− type, that is, there will be no diodes with a p−n+ junction. In the memory array of FIG. 6, three rail-stacks 120, 121, and 122 are illustrated which will create only a single type diode, specifically p+n− diodes. Rail-stack 120 comprises, for example: a p+ semiconductor layer 25, about 1000 Å thick; a conductor 126 about 500 Å thick; a p+ semiconductor layer 127 about 1000 Å thick; and an antifuse layer 128 approximately 30 Å thick. These layers may be formed as discussed above. Rail-stack 121 comprises, for example: an n− semiconductor layer 129 about 2000 Å thick; an n+ semiconductor layer 130 about 500 Å thick; a conductor 131 about 500 Å thick; an n+ semiconductor layer 132 about 500 Å thick; and an n− semiconductor layer 133 about 2000 Å thick. The rail-stack 122 has the same layering as the rail-stack 120.

As discussed above, the semiconductor layers may be formed using polysilicon or an amorphous silicon. The conductors may be a highly doped silicon or a metal, metal alloy, silicide or combinations thereof. The dielectric fill in the spaces between the rail-stacks is also used as discussed for the earlier embodiments.

As can be seen from FIG. 6, if antifuse layer 128 is breached, the diodes between the conductors 126 and 131 are all p+n− type, and similarly, the diodes in the next level between conductors 131 and 140 are again all p+n− type. The rail-stacks shown are used throughout the memory array so that the entire array has only p+n− type diodes in its memory cells.

The diodes in the illustrated rail-stacks of FIG. 6 are forward biased towards the conductor 131 and the conductor 141. If need be for a particular application, the diodes can be oriented identically, that is, with all their anodes (or cathodes) pointing upwardly. This can be obtained for the p+n− type diodes by having both a p+ doped and an n− doped semiconductor layer in each of the rail-stacks. For instance, layer 132 and 133 would be replaced with a p+ layer and layer 142 would be replaced with n– and n+ layers. This still maintains only one type of diode (p+n–) throughout the array.

While FIG. 6 shows that, after the antifuse is breached, only p+n– diodes will be created, an array with only p–n+ type diodes can be fabricated by replacing the p+ layers with an n+ layer and replacing the n+ and n– layers with p+ and p– layers. Also, the array can have the anodes (or cathodes) vertically aligned as discussed above for the p+n– type diodes.

It should be noted that for the embodiment of FIG. 6, planarization occurs on an n– layer, for example, n– semiconductor layer 133 is planarized before the formation of antifuse layer of rail-stack 122. For this reason, semiconductor layer 133 is somewhat thicker than, for example, semiconductor layer 132. More care is required in the polishing of layer semiconductor 133 to assure uniformity across the wafer and to obtain uniform diode characteristics. In this connection, a "hard" mask may be used, such as described in co-pending, commonly-assigned, patent application Ser. No. 09/746,469, filed by N. Johan Knall and James M. Cleeves, and titled "Methods Of Forming Nonvolatile Memory Devices Utilizing A Hard Mask," the disclosure of which is incorporated by reference herein. One result of having thicker n– layers is that rail-stack 121 is thicker than the rail-stacks 120 and 122.

Figure 7:
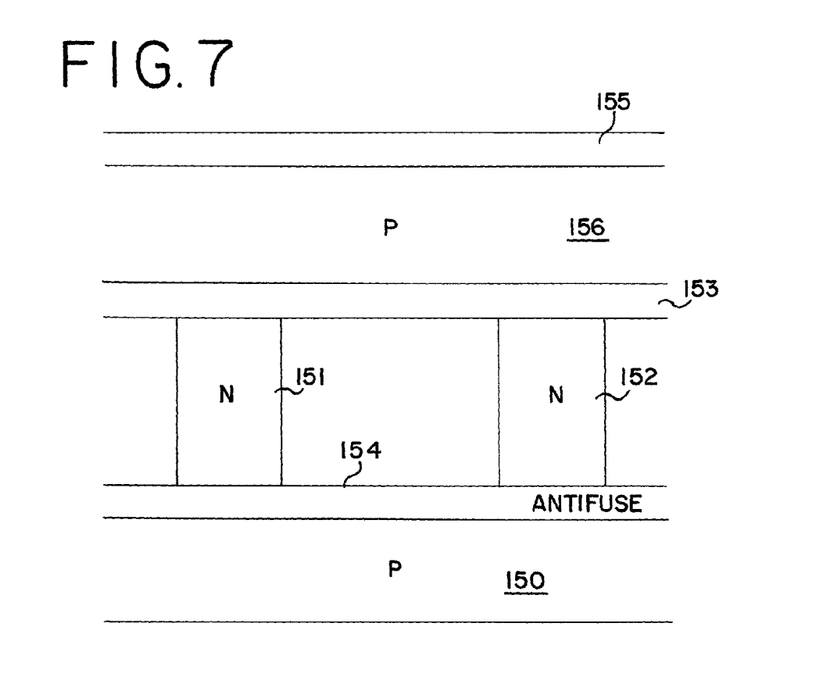
FIG. 7 illustrates a cross-sectional elevation view of a memory array employing rails and fabricated in accordance with the invention.

Another memory array having a single type diode junction is illustrated in FIG. 7. This memory array employs rails of a uniformly doped semiconductor material, rather than the composite rail-stacks previously described. More specifically, as shown in FIG. 7, rails 150 of, for example, a polysilicon doped with a p– type dopant, are defined from a layer of polysilicon. In similarity with processes used to fabricate the rail-stacks described above, the spaces between rails 150 are filled with a dielectric material and planarized. Then, in accordance with the invention, an antifuse layer 154 is formed using the HDP oxidation process described above.

Next, an n– type polysilicon layer is formed on antifuse layer 154 and orthogonal rails 151 and 152 formed by photolithography and etching processes. Then, following a dielectric fill step and a planarization step, another antifuse layer 153 is formed using the HDP oxidation process described above. Next, p– type polysilicon rails 156 are formed and an antifuse layer 155 is formed on rails 156 using the HDP oxidation process described above.

Each of the polysilicon rails 150, 151, 152, and 156 and like rails at other levels are connected to circuitry in a substrate. Each of the rails is both a conductor and one-half a diode for cells. For instance, a cell is formed between rail 156 and rail 151, and another cell between rail 156 and rail 152. Likewise, cells are formed between the rail 150 and each of the rails, 151 and 152.

An advantage of the memory array illustrated in FIG. 7 is its ease of fabrication. However, typically, the semiconductor rails are less conductive than the metal conductors previously described, and, consequently, the rails will have more electrical resistance. Greater electrical resistance will increase the access time of the cells, particularly in a large memory array. The conductivity of the rails can be improved by increasing the concentration of the p type and n type dopants. However, when this is done, the leakage current can also increase. For any given array, decreased resistance can be traded-off for increased leakage and vice-versa. It is contemplated that this memory array will typically be used in a relatively small device where high-speed access is not critical.

As can be seen from FIG. 7, after the antifuse is breached, the diodes associated with each of the cells are the same; specifically the p and n type dopant concentrations for each diode is the same.

Those skilled in the art will appreciate that the process of the invention can be applied to the fabrication of memory arrays having architecture that is different from that described above. For example, in the memory arrays described above, two cells share a conductor. However, an array may also be fabricated that incorporates two conductors for each cell that are not shared with other cells. A dielectric may be used to separate each such cell. Also, while above diodes formed in alternate cells "point" in the same direction in some of the memory arrays, this is not necessary. For example, a shared conductor may have that diodes point-in from above and point-out from below. However, as will be familiar to those skilled in the art, such a memory array requires different driving circuitry in the substrate than that used for the memory arrays illustrated above Those skilled in the art will recognize the HDP oxidation process can be used to form antifuse layers in a variety of memory devices. For example, vertically stacked field programmable memory array is described in commonly-assigned U.S. Pat. No. 6,034,882, entitled "Vertically Stacked Field Programmable Nonvolatile Memory And Method Of Fabrication," the disclosure of which is incorporated by reference herein. In the memory array disclosed, each memory cell includes vertically separated input and output terminals. The input and output terminals can be formed by metal conductors. The pillars are comprised of a steering element and a state change element, where the state change element overlies the steering element. The state change element can be formed by a dielectric rupture antifuse layer positioned intermediate to two semiconductor layers. In accordance with the present invention, the HDP oxidation process described above can be used to form the dielectric rupture antifuse of the state change element.

Thus it is apparent that there has been disclosed, in accordance with the invention, a process for fabricating a dielectric film using a high density plasma oxidation process that fully provides the advantages set forth above. Although the process has been described and illustrated with reference to specific illustrative embodiments thereof, it is not intended that the invention be limited to those illustrative embodiments. Those skilled in the art will recognize that variations and modifications can be made without departing from the spirit of the invention. For example, the inventive process can be used to fabricate a wide variety of components in an integrated circuit device beyond those described in the illustrative embodiments. For example, the process can be used to fabricate oxide sidewall layers and the like. It is therefore intended to include within the invention all such variations and modification as fall within the scope of the appended claims.

The invention claimed is:

1. A process for forming an antifuse comprising:
    exposing an oxidizable surface to an plasma oxidation process for an initial exposure time; and
    growing an oxide film on the oxidizable surface, and
    wherein the oxide film grows to a predetermined thickness at an end of the initial exposure time, and wherein additional exposure to the plasma oxidation process beyond the initial exposure time does not result in a significant further increase in thickness of the oxide film.

2. The process of claim 1, wherein the plasma oxidation process comprises providing a substrate having a back surface opposite a face surface, wherein the oxidizable surface comprises at least a portion of the face surface, and contacting the back surface with a cooling medium.

3. The process of claim 1, wherein the plasma oxidation process comprises applying an RF bias voltage to the oxidizable surface.

4. The process of claim 1, wherein the plasma oxidation process comprises generating a plasma comprising oxygen and an inert gas.

5. The process of claim 1, further comprising subjecting the oxidizable surface to a plasma containing a nitrogen species prior to exposing the oxidizable surface to a plasma oxidation process.

6. The process of claim 5, wherein subjecting the oxidizable surface to a plasma containing a nitrogen species comprises subjecting the oxidizable surface to a plasma formed by a gas selected from the group consisting of nitrogen, nitrous oxide and ammonia.

7. A plasma oxidation process comprising:
exposing an oxidizable surface to an oxidizing plasma, wherein the oxidizing plasma has an activity relative to the oxidizable surface;
forming an oxide film on the oxidizable surface; and
regulating the oxidizing plasma activity to limit a rate of formation of the oxide film by regulating at least one of the following: reaction kinetics, growth initiation, and surface energy.

8. The plasma oxidation process of claim 7, wherein regulating the oxidizing plasma activity comprises bombarding the oxidizable surface with energized ions prior to exposing the oxidizable surface to the oxidizing plasma.

9. The plasma oxidation process of claim 8, wherein bombarding the oxidizable surface comprises bombarding the oxidizable surface to remove contaminants from the oxidizable surface.

10. The plasma oxidation process of claim 8, wherein bombarding the oxidizable surface comprises bombarding the oxidizable surface to remove other oxide layers present on the oxidizable surface.

11. The plasma oxidation process of claim 8, wherein bombarding the oxidizable surface comprises bombarding the oxidizable surface to facet the oxidizable surface.

12. The plasma oxidation process of claim 8, wherein bombarding the oxidizable surface with energized ions comprises subjecting the oxidizable surface to a bias voltage.

13. The plasma oxidation process of claim 7, wherein regulating the oxidizing plasma activity comprises diluting the oxidizing plasma with an inert gas.

14. The plasma oxidation process of claim 7 further comprising providing a substrate having a back surface opposite a face surface, wherein the oxidizable surface comprises at least a portion of the face surface, and wherein regulating the oxidizing plasma activity comprises contacting the back surface with a cooling medium.

15. The plasma oxidation process of claim 7, wherein regulating the oxidizing plasma activity comprises applying an RF bias voltage to the oxidizable surface.

16. The plasma oxidation process of claim 7 further comprising:
providing a plasma chamber;
placing a substrate in the plasma chamber; and
igniting the oxidizing plasma after placing the substrate in the plasma chamber.

17. The plasma oxidation process of claim 7 further comprising igniting an inert gas plasma prior to igniting the oxidizing plasma.

18. The plasma oxidation process of claim 17 further comprising placing the oxidizable surface in the inert gas plasma.

19. The plasma oxidation process of claim 7 further comprising providing a plasma power source having an output power, and wherein regulating the oxidizing plasma comprises limiting the output power to a predetermined level.

20. The plasma oxidation process of claim 7, wherein the oxidizable surface comprises silicon.

21. The plasma oxidation process of claim 7, wherein the oxidizable surface comprises a semiconductor element of an antifuse device.

22. The plasma oxidation process of claim 7, wherein exposing an oxidizable surface to an oxidizing plasma comprises exposing the oxidizable surface to a plasma comprising oxygen.

23. The plasma oxidation process of claim 7, wherein regulating the oxidizing plasma activity comprises applying a bias voltage and sputtering a portion of the oxide film while simultaneously forming the oxide film.

24. A process for fabricating an oxide film in a semiconductor device comprising the steps of:
forming a semiconductor layer;
exposing the semiconductor layer to a plasma comprising oxygen,
wherein the plasma has an activity relative to the semiconductor layer;
forming an oxide film on the semiconductor layer; and
regulating the plasma activity to limit a rate of formation of the oxide film by regulating at least one of the following: reaction kinetics, growth initiation, and surface energy.

25. The process of claim 24, wherein the step of forming a semiconductor layer comprises forming a doped semiconductor layer.

26. The process of claim 24, wherein the step of forming a semiconductor layer comprises forming a silicon layer.

27. The process of claim 24, wherein the step of forming a semiconductor layer comprises forming a germanium layer.

28. The process of claim 24 further comprising forming an electrically conductive layer prior to forming the semiconductor layer.

29. The process of claim 24, wherein the oxide film comprises a gate oxide layer.

30. The process of claim 24, wherein the oxide film comprises a passivation layer.

31. A process for fabricating a dielectric film in a semiconductor device comprising the steps of:
exposing an oxidizable surface to a plasma comprising an oxygen species and a nitrogen species,
wherein the plasma has an activity relative to the oxidizable surface;
forming an oxynitride film on the oxidizable surface; and
regulating the plasma activity to limit a rate of formation of the oxynitride film by regulating at least one of the following: reaction kinetics, growth initiation, and surface energy.

32. The process of claim 31, wherein the nitrogen species comprises a compound selected from the group consisting of nitrogen, ammonia and nitrous oxide.

33. The process of claim 31, wherein the step of forming an oxynitride film comprises a gate oxide layer.

34. The process of claim 31, wherein the step of forming an oxynitride film comprises a passivation layer.

35. The process of claim 31, wherein the step of forming an oxynitride film comprises an antifuse layer.

36. The process of claim 31, further comprising subjecting the oxidizable surface to a plasma containing a nitrogen species prior to exposing the oxidizable surface to a plasma comprising an oxygen species and a nitrogen species.

37. The process of claim 36, wherein subjecting the oxidizable surface to a plasma containing a nitrogen species comprises subjecting the oxidizable surface to a plasma formed by a gas selected from the group consisting of nitrogen, nitrous oxide and ammonia.

38. A process for fabricating an oxide film in a semiconductor device comprising the steps of:
exposing an oxidizable surface to a plasma comprising oxygen,
wherein the plasma has an activity relative to the oxidizable surface;
forming an oxide film on the oxidizable surface;
regulating the plasma activity to limit a rate of formation of the oxide film by regulating at least one of the following: reaction kinetics, growth initiation, and surface energy; and
forming a silicon nitride layer overlying the oxide film.

39. The process of claim 38, wherein the step of forming a silicon nitride layer comprises plasma deposition of silicon nitride.

40. The process of claim 38, wherein the step of forming a silicon nitride layer comprises chemical vapor deposition of silicon nitride.

41. The process of claim 38, further comprising subjecting the oxidizable surface to a plasma containing a nitrogen species prior to exposing the oxidizable surface to a plasma comprising oxygen.

42. The process of claim 41, wherein subjecting the oxidizable surface to a plasma containing a nitrogen species comprises subjecting the oxidizable surface to a plasma formed by a gas selected from the group consisting of nitrogen, nitrous oxide and ammonia.

43. A process for fabricating a dielectric film in a semiconductor device comprising the steps of:
exposing an oxidizable surface to a plasma comprising an oxygen species,
wherein the plasma has an activity relative to the oxidizable surface;
forming an oxide film having an upper surface on the oxidizable surface;
regulating the plasma activity to limit a rate of formation of the oxide film by regulating at least one of the following: reaction kinetics, growth initiation, and surface energy; and
forming an oxynitride region at the upper surface of the oxide film.

44. The process of claim 43, wherein the step of forming an oxynitride region comprises subjecting the oxide film to a plasma containing a nitrogen species.

45. The process of claim 44, wherein subjecting the oxide film to a plasma containing a nitrogen species comprises subjecting the oxide film to a plasma formed by a gas selected from the group consisting of nitrogen, nitrous oxide and ammonia.

46. The process of claim 43, further comprising subjecting the oxidizable surface to a plasma containing a nitrogen species prior to exposing the oxidizable surface to a plasma comprising oxygen.

47. The process of claim 46, wherein subjecting the oxidizable surface to a plasma containing a nitrogen species comprises subjecting the oxidizable surface to a plasma formed by a gas selected from the group consisting of nitrogen, nitrous oxide and ammonia.

48. A plasma oxidation process comprising:
exposing an oxidizable surface to an oxidizing plasma, wherein the oxidizing plasma has an activity relative to the oxidizable surface;
forming an oxide film on the oxidizable surface; and
regulating the oxidizing plasma activity to limit a rate of formation of the oxide film to a predetermined growth rate while the oxidizable surface is being exposed to the oxidizing plasma.

49. The plasma oxidation process of claim 48, wherein regulating the oxidizing plasma activity comprises bombarding the oxidizable surface with energized ions prior to exposing the oxidizable surface to the oxidizing plasma.

50. The plasma oxidation process of claim 49, wherein bombarding the oxidizable surface comprises bombarding the oxidizable surface to remove contaminants from the oxidizable surface.

51. The plasma oxidation process of claim 49, wherein bombarding the oxidizable surface comprises bombarding the oxidizable surface to remove other oxide layers present on the oxidizable surface.

52. The plasma oxidation process of claim 49, wherein bombarding the oxidizable surface comprises bombarding the oxidizable surface to facet the oxidizable surface.

53. The plasma oxidation process of claim 49, wherein bombarding the oxidizable surface with energized ions comprises subjecting the oxidizable surface to a bias voltage.

54. The plasma oxidation process of claim 48, wherein regulating the oxidizing plasma activity comprises diluting the oxidizing plasma with an inert gas.

55. The plasma oxidation process of claim 48 further comprising providing a substrate having a back surface opposite a face surface, wherein the oxidizable surface comprises at least a portion of the face surface, and wherein regulating the oxidizing plasma activity comprises contacting the back surface with a cooling medium.

56. The plasma oxidation process of claim 48, wherein regulating the oxidizing plasma activity comprises applying an RF bias voltage to the oxidizable surface.

57. The plasma oxidation process of claim 48 further comprising:
providing a plasma chamber;
placing a substrate in the plasma chamber; and
igniting the oxidizing plasma after placing the substrate in the plasma chamber.

58. The plasma oxidation process of claim 48 further comprising igniting an inert gas plasma prior to igniting the oxidizing plasma.

59. The plasma oxidation process of claim 58 further comprising placing the oxidizable surface in the inert gas plasma.

60. The plasma oxidation process of claim 48 further comprising providing a plasma power source having an output power, and wherein regulating the oxidizing plasma comprises limiting the output power to a predetermined level.

61. The plasma oxidation process of claim 48, wherein the oxidizable surface comprises silicon.

62. The plasma oxidation process of claim 48, wherein the oxidizable surface comprises a semiconductor element of an antifuse device.

63. The plasma oxidation process of claim 48, wherein exposing an oxidizable surface to an oxidizing plasma comprises exposing the oxidizable surface to a plasma comprising oxygen.

64. The plasma oxidation process of claim 48, wherein regulating the oxidizing plasma activity comprises applying a bias voltage and sputtering a portion of the oxide film while simultaneously forming the oxide film.

65. A process for fabricating an oxide film in a semiconductor device comprising the steps of:
forming a semiconductor layer;

exposing the semiconductor layer to a plasma comprising oxygen, wherein the plasma has an activity relative to the semiconductor layer;

forming an oxide film on the semiconductor layer; and regulating the plasma activity to limit a rate of formation of the oxide film to a predetermined growth rate while the semiconductor layer is being exposed to the plasma.

66. The process of claim 65, wherein the step of forming a semiconductor layer comprises forming a doped semiconductor layer.

67. The process of claim 65, wherein the step of forming a semiconductor layer comprises forming a silicon layer.

68. The process of claim 65, wherein the step of forming a semiconductor layer comprises forming a germanium layer.

69. The process of claim 65 further comprising forming an electrically conductive layer prior to forming the semiconductor layer.

70. The process of claim 65, wherein the oxide film comprises a gate oxide layer.

71. The process of claim 65, wherein the oxide film comprises a passivation layer.

72. A process for fabricating a dielectric film in a semiconductor device comprising the steps of:

exposing an oxidizable surface to a plasma comprising an oxygen species and a nitrogen species, wherein the plasma has an activity relative to the oxidizable surface;

forming an oxynitride film on the oxidizable surface; and regulating the plasma activity to limit a rate of formation of the oxynitride film to a predetermined growth rate while the oxidizable surface is being exposed to the plasma.

73. The process of claim 72, wherein the nitrogen species comprises a compound selected from the group consisting of nitrogen, ammonia and nitrous oxide.

74. The process of claim 72, wherein the step of forming an oxynitride film comprises a gate oxide layer.

75. The process of claim 72, wherein the step of forming an oxynitride film comprises a passivation layer.

76. The process of claim 72, wherein the step of forming an oxynitride film comprises an antifuse layer.

77. The process of claim 72, further comprising subjecting the oxidizable surface to a plasma containing a nitrogen species prior to exposing the oxidizable surface to a plasma comprising an oxygen species and a nitrogen species.

78. The process of claim 77, wherein subjecting the oxidizable surface to a plasma containing a nitrogen species comprises subjecting the oxidizable surface to a plasma formed by a gas selected from the group consisting of nitrogen, nitrous oxide and ammonia.

79. A process for fabricating an oxide film in a semiconductor device comprising the steps of:

exposing an oxidizable surface to a plasma comprising oxygen, wherein the plasma has an activity relative to the oxidizable surface;

forming an oxide film on the oxidizable surface;

regulating the plasma activity to limit a rate of formation of the oxide film to a predetermined growth rate while the oxidizable surface is being exposed to the plasma; and forming a silicon nitride layer overlying the oxide film.

80. The process of claim 79, wherein the step of forming a silicon nitride layer comprises plasma deposition of silicon nitride.

81. The process of claim 79, wherein the step of forming a silicon nitride layer comprises chemical vapor deposition of silicon nitride.

82. The process of claim 79, further comprising subjecting the oxidizable surface to a plasma containing a nitrogen species prior to exposing the oxidizable surface to a plasma comprising oxygen.

83. The process of claim 82, wherein subjecting the oxidizable surface to a plasma containing a nitrogen species comprises subjecting the oxidizable surface to a plasma formed by a gas selected from the group consisting of nitrogen, nitrous oxide and ammonia.

84. A process for fabricating a dielectric film in a semiconductor device comprising the steps of:

exposing an oxidizable surface to a plasma comprising an oxygen species, wherein the plasma has an activity relative to the oxidizable surface;

forming an oxide film having an upper surface on the oxidizable surface;

regulating the plasma activity to limit a rate of formation of the oxide film to a predetermined growth rate while the oxidizable surface is being exposed to the plasma; and forming an oxynitride region at the upper surface of the oxide film.

85. The process of claim 84, wherein the step of forming an oxynitride region comprises subjecting the oxide film to a plasma containing a nitrogen species.

86. The process of claim 85, wherein subjecting the oxide film to a plasma containing a nitrogen species comprises subjecting the oxide film to a plasma formed by a gas selected from the group consisting of nitrogen, nitrous oxide and ammonia.

87. The process of claim 83, further comprising subjecting the oxidizable surface to a plasma containing a nitrogen species prior to exposing the oxidizable surface to a plasma comprising oxygen.

88. The process of claim 87, wherein subjecting the oxidizable surface to a plasma containing a nitrogen species comprises subjecting the oxidizable surface to a plasma formed by a gas selected from the group consisting of nitrogen, nitrous oxide and ammonia.

* * * * *